United States Patent
Mienkina et al.

(10) Patent No.: US 8,278,988 B2
(45) Date of Patent: Oct. 2, 2012

(54) METHOD AND APPARATUS FOR GENERATING A MODULATED WAVEFORM SIGNAL

(75) Inventors: Martin Mienkina, Bystrice (CZ); Pavel Grasblum, Frenstat Pod Radhostem (CZ)

(73) Assignee: Freescale Semiconductor, Inc., Austin, TX (US)

( * ) Notice: Subject to any disclaimer, the term of this patent is extended or adjusted under 35 U.S.C. 154(b) by 70 days.

(21) Appl. No.: 12/997,104

(22) PCT Filed: Jun. 27, 2008

(86) PCT No.: PCT/IB2008/052590
§ 371 (c)(1), (2), (4) Date: Dec. 9, 2010

(87) PCT Pub. No.: WO2009/156795
PCT Pub. Date: Dec. 30, 2009

(65) Prior Publication Data
US 2011/0084749 A1 Apr. 14, 2011

(51) Int. Cl.
*H03H 11/26* (2006.01)
(52) U.S. Cl. .......................... 327/263; 327/264; 327/170
(58) Field of Classification Search .................. 327/263, 327/264, 113, 114, 116, 170, 172; 377/47, 377/48
See application file for complete search history.

(56) References Cited

U.S. PATENT DOCUMENTS

| 5,124,669 | A | * | 6/1992 | Palmer et al. | 331/1 A |
| 6,439,679 | B1 | | 8/2002 | Roylance | |
| 6,909,311 | B2 | * | 6/2005 | Foley et al. | 327/141 |
| 6,965,260 | B1 | | 11/2005 | Ye et al. | |
| 6,998,928 | B2 | | 2/2006 | Stengel et al. | |
| 7,017,069 | B2 | | 3/2006 | Kudo et al. | |
| 7,469,354 | B2 | * | 12/2008 | Minzoni et al. | 713/503 |
| 7,598,784 | B2 | * | 10/2009 | Hunter | 327/170 |
| 2004/0222866 | A1 | | 11/2004 | Stengel et al. | |
| 2007/0195876 | A1 | | 8/2007 | Prodic | |
| 2007/0273416 | A1 | | 11/2007 | Heyne | |

FOREIGN PATENT DOCUMENTS

| WO | 00/03317 | 1/2000 |
| WO | 2004/109917 A1 | 12/2004 |
| WO | 2005/011118 A2 | 2/2005 |

OTHER PUBLICATIONS

International Search Report and Written Opinion correlating to PCT/IB2008/052590 dated Mar. 24, 2009.

* cited by examiner

*Primary Examiner* — An Luu

(57) ABSTRACT

A semiconductor device comprising timer logic for generating a first modulated waveform signal, and delay logic, operably coupled to the timer logic and arranged to provide a first delay in a rising edge of the first modulated waveform signal generated by the timer logic; and provide a second delay in a falling edge of the first modulated waveform generated by the timer logic. The first delay and second delay of the first modulated waveform forms a second, refined modulated waveform signal that comprises a higher frequency resolution than a frequency resolution of the first modulated waveform signal.

19 Claims, 6 Drawing Sheets

METHOD AND APPARATUS FOR GENERATING A MODULATED WAVEFORM SIGNAL

FIELD OF THE INVENTION

The field of this invention relates to a method and apparatus for generating a modulated waveform signal, and more particularly to a semiconductor device comprising delay logic arranged to generate a refined modulated waveform signal.

BACKGROUND OF THE INVENTION

It is known for microcontrollers and the like to be used to drive, by way of example, switch mode power supplies, resonant converters, induction heaters, etc, whereby the microcontroller is required to generate a high frequency modulated signal waveform, for example in the region of 150 to 1000 kHz. Such modulated waveform signals are required to comprise a precise frequency resolution, for example in the range of 11 to 14 bits. In addition, suitable microcontrollers are typically required to be highly integrated, in order to provide reliable and low-cost solutions, whilst also being flexible in their operation and architecture.

In order to keep both costs and power consumption down to acceptable levels, semiconductor devices comprising microcontrollers are often required to utilise slower operating clock speeds, and slower, less expensive components. However, a problem with existing microcontroller architectures is that such restrictions on the operating clock speeds have the detrimental effect on the microcontrollers in that they are incapable of generating modulated signal waveforms comprising high enough frequencies, whilst also providing high enough frequency resolution for minimizing output voltage ripple and, thus, also noise levels, as required for switched mode power supplies utilized in the telecommunication industry, where designers must respect regulations of the International Telecommunication Union standard ITU-T O.41 and specifically the standard for Psophometric Noise For Use On Telephony-Type Circuits' tests.

Typically, current on-chip timers and PWM (Pulse Width Modulation) modules are able to achieve a maximum frequency resolution of less than 10 bits, for a 100 kHz waveform. As will be appreciated, for existing applications where a frequency resolution of 11 to 14 bits is required for up to a 1000 kHz waveform, these current on-chip timers and PWM modules are inadequate.

In order to overcome this problem, whilst maintaining costs and power consumption down to acceptable levels, it is known for on-chip timers and PWM modules to be operably coupled to an external digital to analogue converter (DAC) and voltage controlled oscillator (VCO). FIG. 1 illustrates an example of such a known solution comprising a microcontroller to generate a high frequency modulated waveform signal comprising a high resolution. The semiconductor device 100 comprises an on-chip timer 110 arranged to generate a modulated waveform signal.

As previously mentioned, in order to keep costs and power consumption down to an acceptable level, semiconductor devices (microcontrollers) are required to utilise slower operating clock speeds, and slower, less expensive components. Accordingly, the timer 110 is capable of generating, say, a 'coarse' 100 kHz modulated waveform ($MW_{rough}$) comprising a resolution of less than 10 bits. The coarse modulated waveform ($MW_{rough}$) is then provided to an external digital to ($MW_{rough}$) analogue converter (DAC) 120 and voltage controlled oscillator (VCO) 130. In this manner, the external DAC 120 and VCO 130 are able to refine the coarse modulated waveform ($MW_{rough}$) into high-frequency modulated waveform ($MW_{fine}$) of, say, up to 1000 kHz comprising a resolution of 11 to 14 bits.

A problem with this known solution is that there is a need to use external components to refine the on-chip generated modulated waveform. The resolution of the high-frequency generated waveform ($MW_{fine}$) is generally equal to the resolution of the timer modulated waveform ($MW_{rough}$). The higher resolution of the modulated waveform ($MW_{fine}$) may be achieved by lowering the frequency of the timer generated coarse modulated waveform ($MW_{rough}$), which increases the resolution thereof. The frequency level of the coarse modulated waveform ($MW_{rough}$) determines smoothing factors of the external digital-to-analogue converter (DAC) and voltage controlled oscillator (VCO); the higher the smoothing factor the longer the settling time and slower dynamic response of the system. Thus, the chain of components and the characteristics of such a semiconductor device result in reduced reliability, increased system costs and worse dynamic response in comparison to fully integrated systems.

SUMMARY OF THE INVENTION

Embodiments of the invention provide a semiconductor device, and method for generating a modulated waveform signal, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS

In the following, examples will be described in terms of a system-on-chip (SoC) microcontroller comprising integrated timer logic and delay logic. Although examples of the invention will be described in terms of such a system-on-chip (SoC) microcontroller, it will be appreciated that the inventive concept herein described may be embodied in any apparatus that incorporates timer logic and delay logic arranged to generate a modulated waveform signal.

Figure 1:
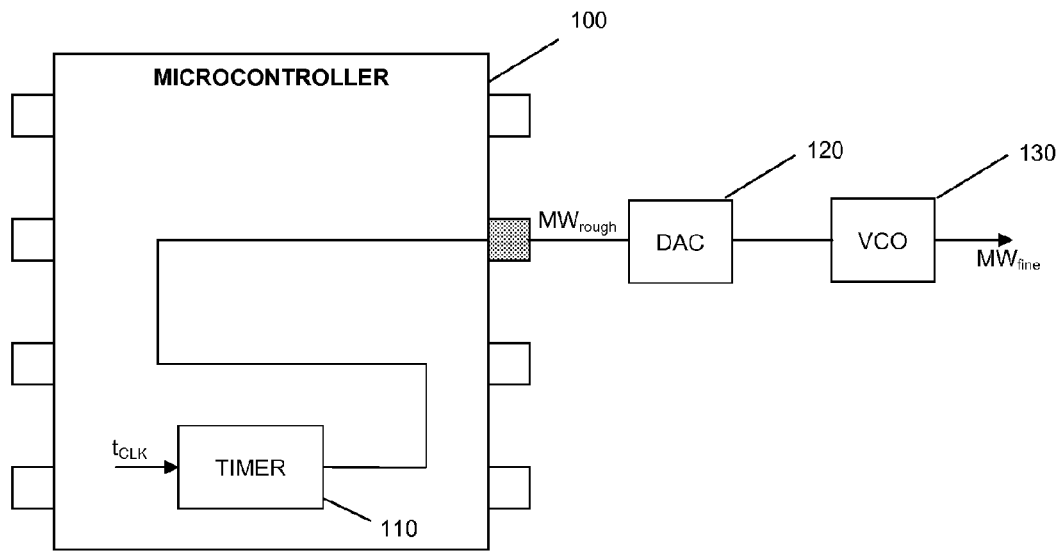
FIG. 1 illustrates an example of such a known solution comprising a microcontroller to generate a high frequency modulated waveform signal comprising a high resolution.
Figure 2:
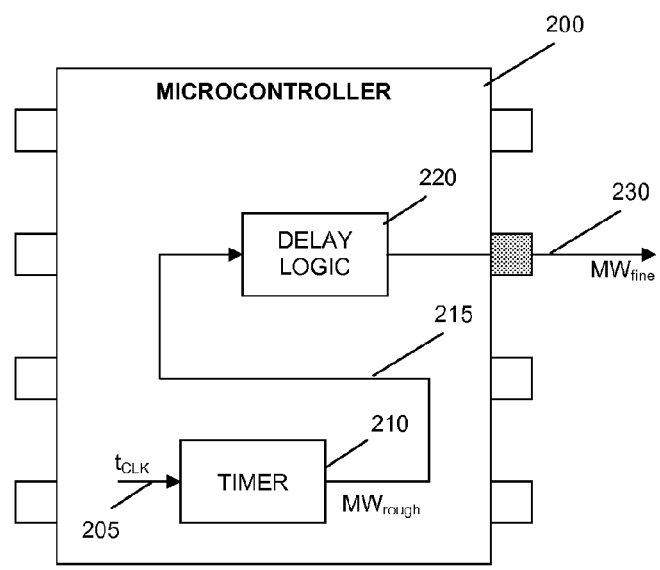
FIG. 2 illustrates an example of a semiconductor device according to some embodiments of the invention.

Referring now to FIG. 2, there is illustrated an example of a semiconductor device 200 adapted according to some embodiments of the invention, which for the illustrated example comprises a system-on-chip (SoC) signal processing logic in the form of a microcontroller. The semiconductor device 200 further comprises timer logic 210 for generating a first modulated waveform signal ($MW_{rough}$) 215 and delay logic 220, operably coupled to the timer logic 210 and arranged to generate a second, refined modulated waveform signal ($MW_{fine}$) 230. In particular, the delay logic 220 is arranged to cause a first delay in a rising edge of the first modulated waveform signal ($MW_{rough}$) (MW 215, and a second delay in a falling edge of the first modulated waveform signal ($MW_{rough}$) 215, such that the resulting second, refined modulated waveform signal ($MW_{fine}$) 230 comprises at least a higher frequency resolution than that of the first modulated waveform signal ($MW_{rough}$) 215.

The delay logic 220 may for instance be further arranged to cause first and second delays in the rising and falling edges respectively of the first modulated waveform signal ($MW_{rough}$) 215 such that the resulting second, refined modulated waveform signal ($MW_{fine}$) 230 comprises a higher pulse width resolution than that of the first modulated waveform signal generated by the timer logic 210.

In this manner, by delaying each of the rising and falling edges of the first modulated waveform signal ($MW_{rough}$) 215, the resulting second, refined modulated waveform signal ($MW_{fine}$) 230 may be provided with a greater frequency resolution, as well as a greater pulse width resolution. Accordingly, a high frequency modulated waveform signal, for example in the range of up to 1000 kHz with, say, a 7-bit resolution, generated by the on-chip timer 210 of the microcontroller can be refined by the delay logic 220 to provide a greater resolution, for example a 11 to 14 bit resolution. Thus, a low cost, reliable, integrated on-chip system may be provided that is capable of generating high frequency, high resolution modulated waveform signal with excellent dynamic response.

Figure 3:
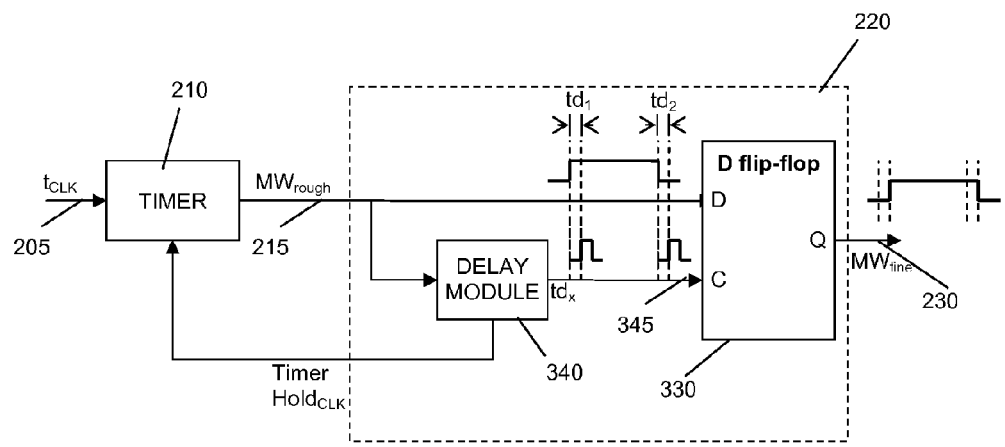
FIG. 3 illustrates an example of delay logic according to some embodiments of the invention.

Referring now to FIG. 3, there is illustrated, in greater detail, an example of delay logic 220. The delay logic 220 is operably coupled to, and arranged to receive, a first modulated waveform signal ($MW_{rough}$) 215 from, timer logic 210. The timer logic 210 receives a timer clock signal ($t_{CLK}$) 205 upon which it bases the first modulated waveform signal ($MW_{rough}$) 215. The delay logic 220 is further arranged to cause a first delay in a rising edge of the first modulated waveform signal ($MW_{rough}$) 215, and a second delay in a falling edge of the first modulated waveform signal ($MW_{rough}$) 215, such that the resulting second, refined modulated waveform signal ($MW_{fine}$) 230 comprises at least a higher frequency resolution than that of the first modulated waveform signal ($MW_{rough}$) 215.

For the example illustrated in FIG. 3, the delay logic 220 comprises a flip-flop 330, which receives, as an input on a data 'D' port thereof, the first modulated waveform signal ($MW_{rough}$) 215. The delay logic 220 further comprises a delay module 340, which also receives as an input the first modulated waveform signal ($MW_{rough}$) 215 generated by the timer logic 210, and comprises an output operably coupled to a clock 'C' port of the flip-flop 330. In this manner, for each triggering edge, for example each rising edge, of the signal received by the 'C' port of the flip-flop 330, the flip-flop 330 samples the signal present at the 'D' port thereof, and outputs the sampled signal.

The delay module 340 is arranged to output a clocking signal ($td_x$) 345 comprising a triggering edge for each rising and falling edge received at its input, and thus for each rising and falling edge of the first modulated waveform signal ($MW_{rough}$) 215. More particularly, the delay module 340 is arranged to output a triggering edge after a first delay period ($td_1$) upon receipt of a rising edge of the first modulated waveform signal ($MW_{rough}$) 215 and to output a triggering edge after a second delay period ($td_2$) upon receipt of a falling edge of the first modulated waveform signal ($MW_{rough}$) 215.

In this manner, the delayed triggering edges output by the delay module 340 cause the flip-flop 330 to sample and output the signal at the 'D' port thereof at delays of ($td_1$) and ($td_2$) following the rising and falling edges of the first modulated waveform signal ($MW_{rough}$) 215 respectively.

Accordingly, the rising and falling edges of the signal output by the flip-flop 330 will be delayed by ($td_1$) and ($td_2$) respectively in relation to the corresponding rising and falling edges of the first modulated waveform signal ($MW_{rough}$) 215. In this manner, by controlling the duration of the delays ($td_1$) and ($td_2$) the frequency and pulse width of the first modulated waveform signal ($MW_{rough}$) 215 may be modified to create a second, refined modulated waveform signal ($MW_{fine}$) comprising higher frequency and/or pulse width resolutions therefor.

Figure 4:
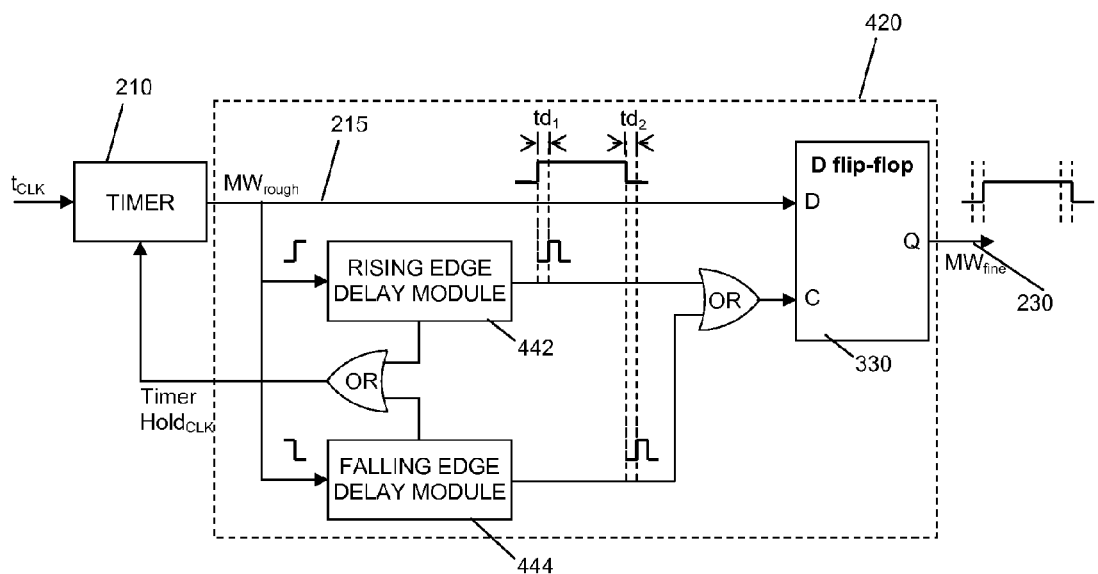
FIG. 4 illustrates an example of delay logic according to some alternative embodiments of the invention.

Referring now to FIG. 4, there is illustrated an example of a delay logic 420 according to some alternative embodiments of the invention. The delay logic 420 for the example illustrated in FIG. 4 comprises a rising edge delay component 442 arranged to cause a first delay in a rising edge of a modulated waveform signal generated by timer logic 210, and a falling edge delay component 444 arranged to cause a second delay in a falling edge of the modulated waveform signal generated by timer logic 210. In this manner, separate delay components are provided for delaying each of the rising and falling edges of the modulated waveform signal generated by the timer logic 210.

Figure 5:
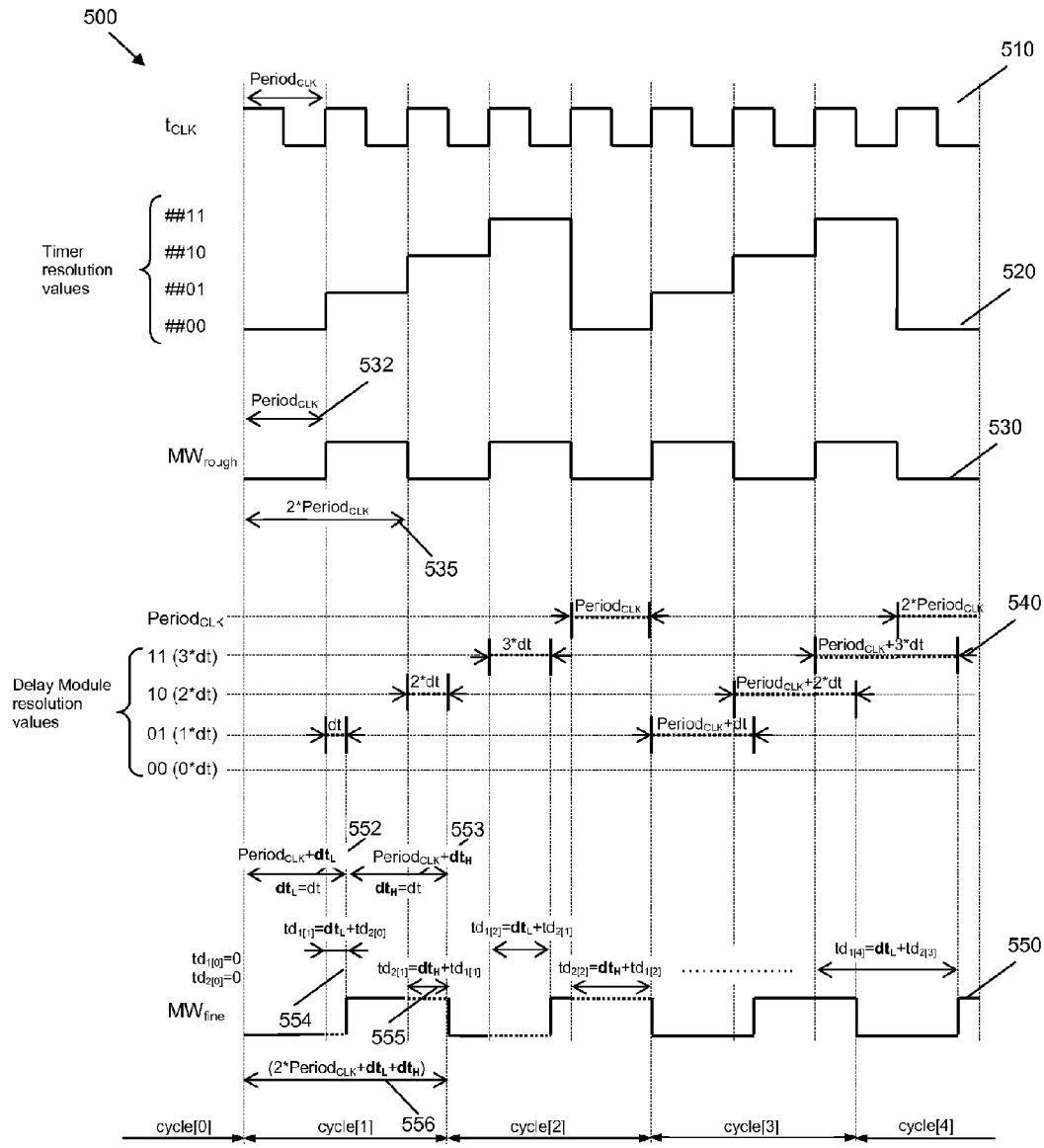
FIG. 5 illustrates an example of a simplified timing chart for the delay logic of FIG. 3 according to some embodiments of the invention.

Referring now to FIG. 5, there is illustrated an example of a simplified timing chart 500 for the example of a delay logic of FIG. 3. A timer clock signal ($t_{CLK}$) 510 is illustrated at the top, comprising period '$Period_{CLK}$'. For the simplified timing chart 500, the timer logic 210 comprises a 4-bit resolution, incremented each rising edge of the timer clock signal ($t_{CLK}$) 510, with a MODULO of 4, as illustrated by at 520. In this manner, the timer logic 210 generates a first modulated waveform signal ($MW_{rough}$) 215 530 comprising a rising edge for each transition of the least significant bit (LSB) of the timer resolution value from a '0' to a '1', and a falling edge for each transition of the LSB of the timer resolution value from a '1' to a '0'. Thus, the timer logic 210 generates a first modulated waveform signal ($MW_{rough}$) 215 530 comprising a period 535 of '2* $Period_{CLK}$', and a pulse width 532 of '$Period_{CLK}$'.

The timing chart 500 also illustrates the resolution values 540 of the delay module 340 of FIG. 3, which for the illustrated example comprises a 2-bit resolution, and a MODULO of 4. The resolution values 540 of the delay module 340 are incremented each rising and falling edge of the first modulated waveform signal ($MW_{rough}$) 215 530, albeit with each increment being delayed as follows.

The timing chart 500 is based on an example of waveform modulation with a fixed 50% duty cycle. In this particular case, both high and low pulse widths of the waveform signal are set to '$Period_{CLK}$+dt' 552 553. Thus, the period of such a waveform signal is '2*($Period_{CLK}$+dt)' 556.

For each rising edge of the rough modulated waveform signal ($MW_{rough}$) 215 530, the delay module 340 delays incrementing its resolution value 540 by a delay $td_1[k]=dt_L+$ td$_2$[k−1], where k={1,2, . . . } is the waveform cycle, 'dt$_L$' is a required rising edge delay increment and 'td$_2$[k−1]' equals the delay value of the falling edge calculated in the previous waveform cycle 'k−1'. The expression for the rising edge delay, tailored to a particular case in waveform cycle '1', then converts to expression td$_1$[1]=dt$_L$+td$_2$[0] 554, where 'td$_2$[0]' equals to '0', as initialized in the previous waveform cycle '0'.

Similarly, for each falling edge of the rough modulated waveform signal (MW$_{rough}$) 215 530, the delay module 340 delays incrementing its resolution value 540 by a delay td$_2$[k]=dt$_H$+td$_1$[k], where 'dt$_H$' is a required falling edge delay increment and 'td$_1$[k]' equals the rising edge delay value calculated in the same waveform cycle 'k'. The expression for the falling edge delay, expressed for waveform in cycle '1', is given by expression td$_2$[1]=dt$_H$+td$_1$[1] 555, where 'td$_1$[1]= dt$_L$+td$_2$[0]' 554 and 'td$_2$[0]' equals '0'.

The 2-bit delay module, in accordance with the timing chart 500, operates with four incremental delay steps 'x*dt', where x=[0,1,2,3]. Therefore, if any edge delay 'td$_{1(2)}$', is out of the delay module operational range <0,3*dt>, the delay needs to be formed with the help of timer periods 'Period$_{CLK}$' as follows: td$_{1(2)}$=n*Period$_{CLK}$+m*dt, where n=IntegerDivision(td$_{1(2)}$,(4*dt)), m=Modulo Division(td$_{1(2)}$, (4*dt)). These cases are also depicted in chart 500, specifically in the waveform cycles '2', '3' and '4'.

As previously mentioned, the delay module 340 is arranged to output a clocking signal (td$_x$), comprising a triggering edge after a first delay period (td$_1$) upon receipt of a rising edge of the rough modulated waveform signal (MW$_{rough}$) 215 and a triggering edge after a second delay period (td$_2$) upon receipt of a falling edge of the rough modulated waveform signal (MW$_{rough}$) 215, and thereby cause the flip-flop 330 to sample and output the signal at the 'D' port thereof at delays of (td$_1$) and (td$_2$) following the rising and falling edges of the rough modulated waveform signal (MW$_{rough}$) 215 respectively.

In accordance with the timing chart of FIG. 5, the rising and falling edges of the signal output by the flip-flop 330 will be delayed in a k-th waveform cycle by td$_1$[k]=dt$_L$+td$_2$[k−1] 554 and td$_2$[k]=dt$_H$+td$_1$[k] 555 respectively in relation to the corresponding rising and falling edges of the rough modulated waveform signal (MW$_{rough}$) 215. In this manner, by independently controlling the duration of the delays 'dt$_L$' and 'dt$_H$', the frequency and duty cycle of the rough modulated waveform signal (MW$_{rough}$) 215 may be modified to create a refined modulated waveform signal (MW$_{fine}$) comprising a period 556 of '2*Period$_{CLK}$+dt$_L$+dt$_H$' and a pulse width 553 of 'Period$_{CLK}$+dt$_H$'.

More generally, a high pulse width of the refined modulated waveform signal may be expressed as 'i* Period$_{CLK}$+dt$_H$' and a low pulse width of the refined modulated waveform signal may be expressed as 'j*Period$_{CLK}$+dt$_L$', where coefficients 'i' and 'j' depend generally on a timer implementation and a duty cycle of the timer generated rough waveform signal and parameters 'dt$_L$' and 'dt$_H$' comprise rising and falling edge delay increments, respectively, and the period of the refined modulated waveform signal equals to '(i+j)*Period$_{CLK}$+dt$_L$+dt$_H$'.

Furthermore, for the illustrated example, the resolution of the period 556 and pulse width 553 of the refined modulated waveform signal (MW$_{fine}$) are each increased from the 4-bit resolution of the rough modulated waveform signal (MW$_{rough}$) 215, for example comprising a frequency defined by '0100', to a 6-bit resolution (4-bit timer resolution+2-bit delay module resolution), for example comprising a frequency defined by '0100:10'.

Figure 6:
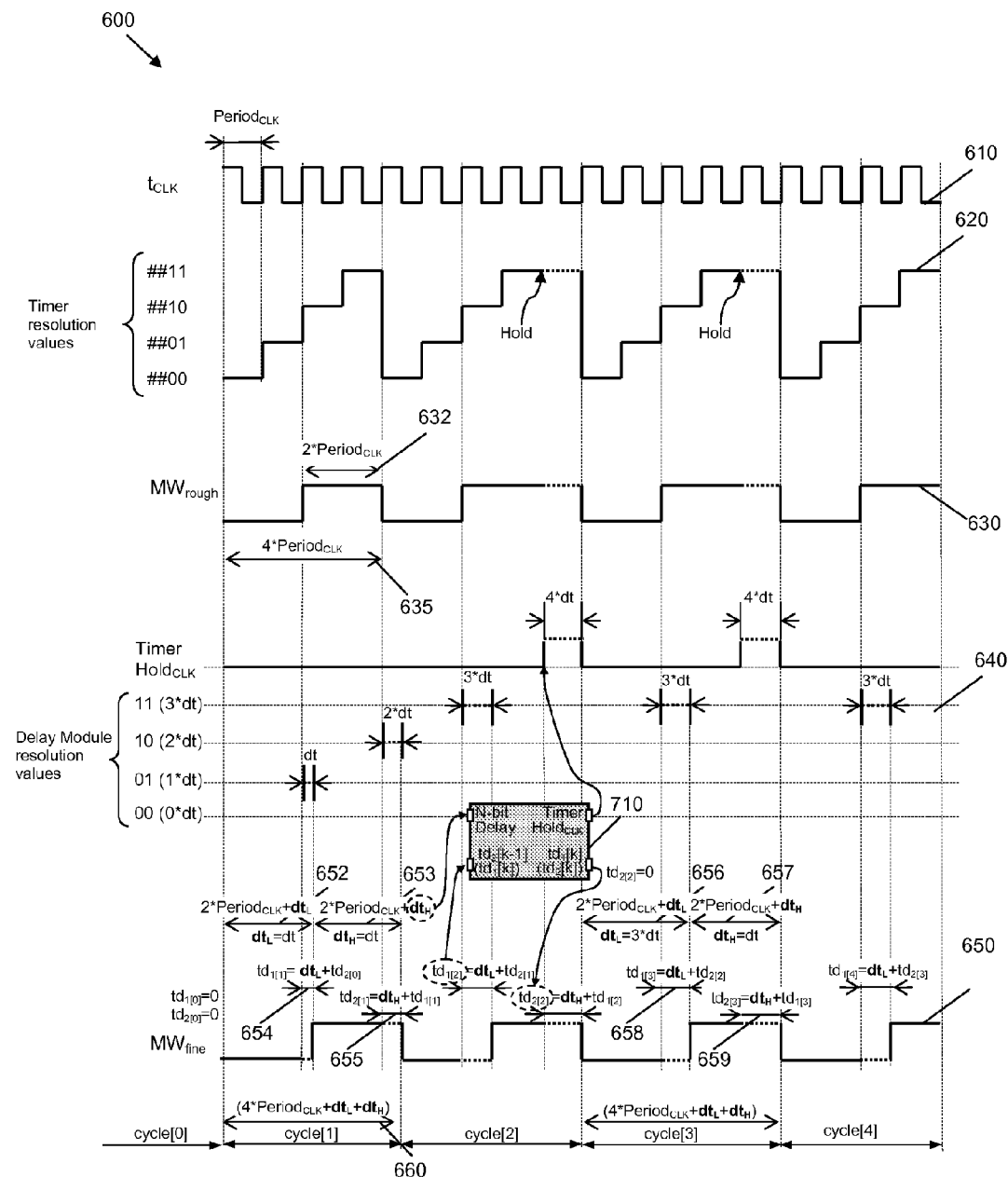
FIG. 6 illustrates an example of a simplified timing chart for the delay logic of FIG. 3 according to some alternative embodiments of the invention.

Referring now to FIG. 6, there is illustrated an example of a simplified timing chart 600 for implementing the delay logic of FIG. 3 according to some alternative embodiments of the invention. A timer clock signal (t$_{CLK}$) 610 is illustrated at the top, comprising period 'Period$_{CLK}$'. Once again, the timer logic 210 of FIG. 2 comprises a 4-bit resolution. For the example illustrated in FIG. 6, the timer resolution is also incremented each rising edge of the timer clock signal (t$_{CLK}$) 610, with a MODULO of 4, as illustrated by waveform 620.

In this manner, the timer logic 210 of FIG. 2 generates a rough modulated waveform signal (MW$_{rough}$) 630 comprising a rising edge for each transition of the second least significant bit (LSB) of the timer resolution value from a '0' to a '1' value, and a falling edge for each transition of the second LSB of the timer resolution value from a '1' to a '0' value. Thus, the timer logic 210 generates a rough modulated waveform signal (MW$_{rough}$) 630 comprising a period 635 of '4*Period$_{CLK}$', and a pulse width 632 of '2*period$_{CLK}$'.

The timing chart 600 also illustrates the resolution values 640 of the delay module 340, which for the illustrated example also comprises a 2-bit resolution, and a MODULO of 4. The resolution values 640 of the delay module 340 are incremented each rising and falling edge of the first modulated waveform signal (MW$_{rough}$) 215 630, albeit with each increment being delayed as follows.

For each rising edge of the rough modulated waveform signal (MW$_{rough}$) 215 630, the delay module 340 delays incrementing its resolution value 640 by a delay, expressed in the k-th waveform cycle by td$_1$[k]=dt$_L$+td$_2$[k−1] 654, where k={1,2, . . . } is the waveform cycle, 'dt$_L$' is a required rising edge delay increment and 'td$_2$[k−1]' equals the delay value of the falling edge calculated in the previous waveform cycle 'k−1'.

Correspondingly, for each falling edge of the rough modulated waveform signal (MW$_{rough}$) 215 630, the delay module 340 delays incrementing its resolution value 640 by a delay, expressed in the k-th waveform cycle by td$_2$[k]=dt$_H$+td$_1$[k] 655, where 'dt$_H$' is a required falling edge delay increment and 'td$_1$[k]' equals the delay value of the rising edge calculated in the same cycle 'k'. The 2-bit delay module, used in FIG. 6, operates with four incremental delay steps 'x*dt', where x=[0,1,2,3]. In this exemplary implementation, if any edge delay 'td$_{1(2)}$', is out of operational range of the delay module <0,3*dt>, the required delay is formed with the help of a delay module 340 timer suspend feature. The delay module 340 is able to cause the timer logic 210 to suspend incrementing its resolution value for one timer clock (t$_{CLK}$) 610 in order re-synchronize it with the refined modulated waveform signal (MW$_{fine}$) 650.

For the example illustrated in FIG. 6, upon overflow of the delay module resolution 640, i.e. when the delay module resolution 640 increments from a value of '11' to a value of '00', the delay module 340 of FIG. 3 causes the timer to hold for, in the case of the illustrated example, a period of '4*dt'. For example, referring back to FIG. 3, the delay module 340 may comprise a 'Timer Hold$_{CLK}$' line, operably coupled to the timer logic 210, thereby enabling the delay module 340 to cause the timer logic 210 to suspend, or otherwise hold the rough modulated waveform signal (MW$_{rough}$) 215. Referring back to FIG. 6, in this manner, the delay module 340 is able to cause the timer logic 210 to suspend incrementing its resolution value for one timer clock (t$_{CLK}$) 610 in order re-synchronize it with the refined modulated waveform signal (MW$_{fine}$) 650.

As previously mentioned, the delay module 340 is arranged to output a clocking signal (td$_x$) comprising a triggering edge after a first delay period (td$_1$) upon receipt of a rising edge of the rough modulated waveform signal ($MW_{rough}$) 215 and a triggering edge after a second delay period ($td_2$) upon receipt of a falling edge of the rough modulated waveform signal ($MW_{rough}$) 215, and thereby cause the flip-flop 330 to sample and output the signal at the 'D' port thereof at delays of ($td_1$) and ($td_2$) following the rising and falling edges of the first modulated waveform signal ($MW_{rough}$) 215 respectively.

Accordingly, and in accordance with the timing chart of FIG. 6, the rising and falling edges of the signal output by the flip-flop 330 will be delayed by $td_1[k]=dt_L+dt_H+td_1[k-1]$ and $td_2[k]=dt_H+dt_L+td_2[k-1]$ respectively in relation to the corresponding rising and falling edges of the rough modulated waveform signal ($MW_{rough}$) 215. In this manner, by controlling the duration of the delays '$dt_L$' and '$dt_H$', the frequency and duty cycle of the rough modulated waveform signal ($MW_{rough}$) 215 may be modified to create a refined modulated waveform signal ($MW_{fine}$) comprising a period 660 of '$4*Period_{CLK}+dt_L+dt_H$', low pulse width 652 of '$2*Period_{CLK}+dt_L$' and high pulse width 653 of '$2*Period_{CLK}+dt_H$', where '$dt_L$' and '$dt_H$' are required rising and falling edge delays, respectively.

In timing chart 600 of FIG. 6, the waveform modulation is carried out in cycles '1' and '2' under conditions '$dt_L=dt$' and '$dt_H=dt$'. Therefore, the period and pulse width of such modulated waveform signal may be expressed as '$2*(2*Period_{CLK}+dt)$' and '$2*Period_{CLK}+dt$', respectively with the help of delay block resolution 'dt'. The timing chart 600 also depicts transition stages following changes to the duty cycle. This particular change is illustrated in waveform cycle '3', where a rising edge delay period '$dt_L$' has been changed to '$3*dt$'. The period of the generated waveform expressed, with the help of delay block resolution 'dt', equals to '$4*(Period_{CLK}+dt)$'. It is demonstrated that delay equations 654, 655, 658 and 659 are functionally identical. They can be represented by the general expression: $td[k]=dt_{PULSE}+td[k-1]$, where '$td[k]$' and '$td[k-1]$' are edge delays at steps 'k' and 'k-1', and '$dt_{PULSE}$' is a fine delay extension of the rough '$Period_{CLK}$' delay.

Figure 7:
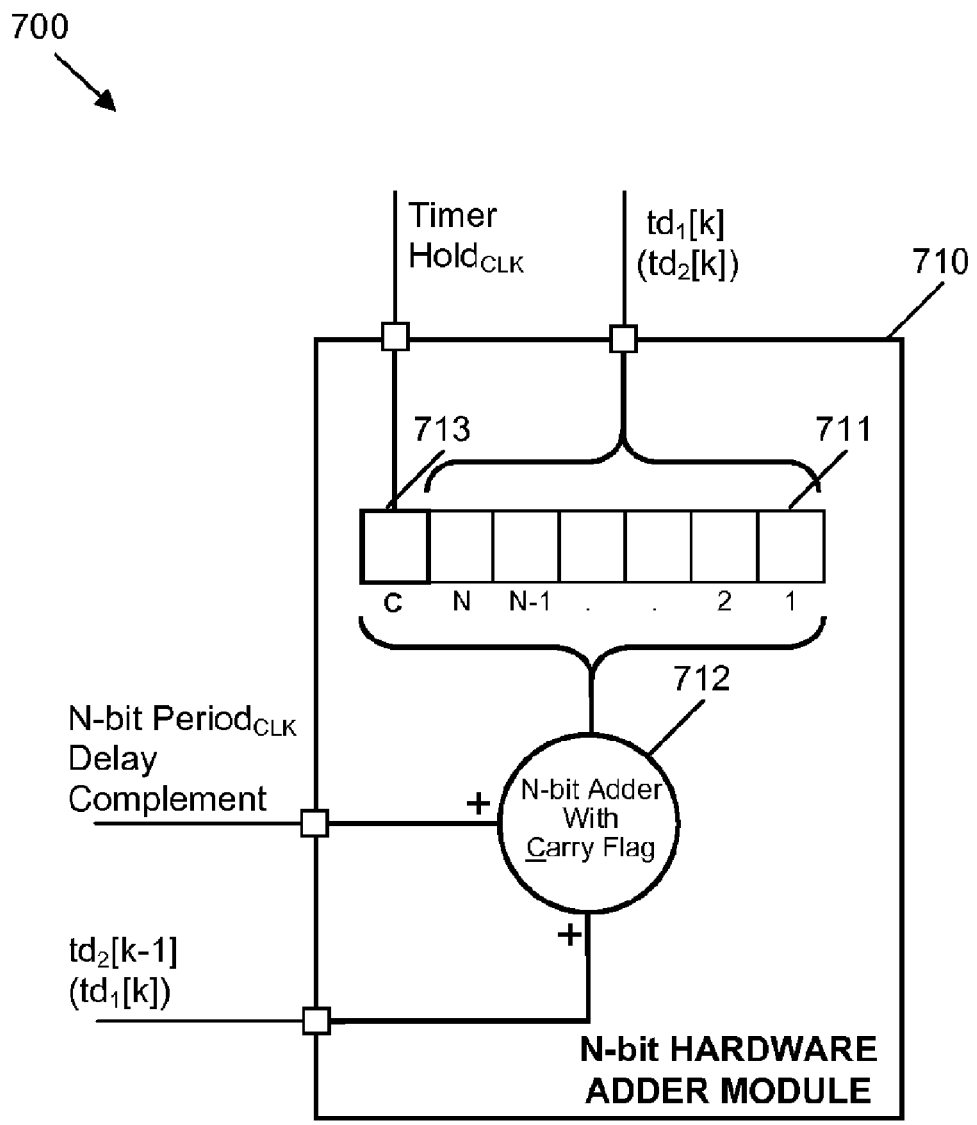
FIG. 7 illustrates an example of an N-bit hardware adder module according to some embodiments of the invention.

Such an equation may be easily implemented, for example, with the help of hardware adder block 710 illustrated in FIG. 7. Such hardware may also generate a 'Timer Hold$_{CLK}$' signal for suspending timer incrementation, and therefore may be capable, in connection with timer 210 and delay module 340, of administering the refining of rough waveform signal 630 and its transformation into refined waveform signal 650.

It is within the contemplation of the invention that the examples described in FIG. 5 and FIG. 6 are not limited to a 4-bit resolution timer 210 and 2-bit resolution delay module 340 exclusively. The illustrated timing charts 500, 600 exploit these resolutions for the purpose of explaining mathematical apparatus and demonstration typical implementation, respectively. It is envisaged that the approach of refining rough modulated waveform signal ($MW_{rough}$) 215 may be expected to handle more advanced systems, where resolutions of the timer 210 and delay block 340 is generally N-bit, $N=\{1,2,\ldots\}$.

Referring now to FIG. 7, there is illustrated an example of a hardware adder block 710, which is capable of performing two tasks. First, the adder block 710 is arranged to calculate refined edge delays for the modulated pulse $td[k]=dt_{PULSE}+td[k-1]$, where: '$td[k]$' and '$td[k-1]$' are edge delays at steps 'k' and 'k-1' and '$dt_{PULSE}$' is a fine delay extension of the rough '$Period_{CLK}$' delay of the modulated pulse. Secondly, the hardware adder block 710 is arranged to generate a 'Timer Hold$_{CLK}$' pulse in order to re-synchronize rough modulated waveform signal ($MW_{rough}$) 215 with the refined modulated waveform signal ($MW_{fine}$) 230, where calculated fine delay $td[k]$, $k=\{1,2,\ldots\}$ exceeds timing capabilities of the delay module 340; i.e. $td[k] \geqq Period_{CLK}$. The 'Timer Hold$_{CLK}$' signal may be generated as an outer product of the refined delay calculation. The signal may be triggered by setting an MSB (most significant bit) (carry flag) 713 in the delay register 711.

Figure 8:
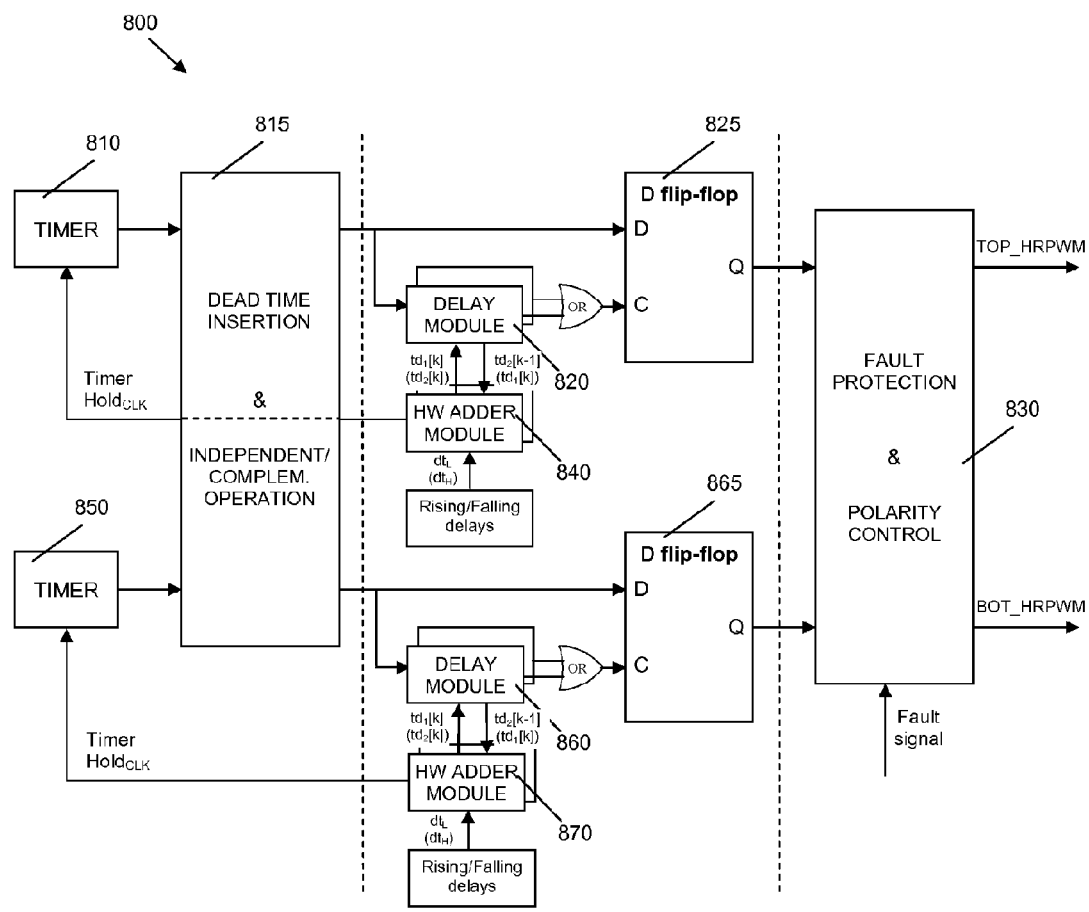
FIG. 8 illustrates an example of a semiconductor device according to an alternative embodiment of the invention.

Referring now to FIG. 8, there is illustrated a semiconductor device 800 according to an alternative example of the invention. The semiconductor device 800 comprises a first modulated waveform signal path and a second modulated waveform signal path.

The first modulated waveform signal path comprises a first timer 810 for generating a first modulated waveform signal. If 'independent/complementary operation & dead_time insertion' logic 815 works in an 'independent' operation, a first modulated waveform signal passes the 'independent/complementary operation & dead_time insertion' logic 815 without any change. If 'independent/complementary operation & dead_time insertion' logic 815 works in 'complementary' operation, a rising edge of a first modulated waveform signal, generated by timer 810, is delayed by '$n*Period_{CLK}$' defining a dead time, which ensures safe complementary switching of power switches.

The second modulated waveform path further comprises delay logic in the form of delay module(s) 820, hardware adder module 840 and flip-flop 825, which are arranged to generate a second, refined modulated waveform signal by causing a first delay in a rising edge of the first modulated waveform signal, and causing a second delay in a falling edge of the first modulated waveform signal, such that the resulting second, refined modulated waveform signal comprises at least a higher frequency resolution than that of the first modulated waveform signal generated by the timer 810 and 'independent/complementary operation & dead_time insertion' logic 815.

The second, refined modulated waveform signal is then provided to fault protection and polarity control logic 830. As will be appreciated by a skilled artisan, the polarity control logic 830 defines an active level of output signal (high/low). The fault protection logic disables the output into inactive state, if there is an event on a fault input pin. The inactive state is typically an opposite level defined by the polarity control, but may also be one of a tri-state level.

Similarly, the second modulated waveform signal path comprises a second timer 850 for generating a third modulated waveform signal. If 'independent/complementary operation & dead_time insertion' logic 815 works in an independent mode of operation, a third modulated waveform signal passes the 'independent/complementary operation & dead_time insertion' logic 815 without any change. If 'independent/complementary operation & dead_time insertion' logic 815 works in a complementary mode of operation, a third modulated waveform signal is generated as complementary signal of a first modulated waveform signal, generated by timer 810 and a rising edge of this modulated waveform signal is delayed by '$n*Period_{CLK}$' defining a dead time, which ensures safe complementary switching of power switches.

The second modulated waveform path further comprises delay logic in the form of delay module(s) 860, hardware adder module 870 and flip-flop 865, which are arranged to generate a fourth, refined modulated waveform signal by causing a first delay in a rising edge of the third modulated waveform signal, and causing a second delay in a falling edge of the third modulated waveform signal such that the resulting fourth, refined modulated waveform signal comprises at least a higher frequency resolution than that of the third modulated waveform signal generated by the timer 850 and 'independent/complementary operation & dead_time insertion' logic 715. The fourth, refined modulated waveform signal is then provided to fault protection and polarity control logic 830.

The delay logic according to any of the examples described herein, may be implemented using any suitable hardware and/or software components. For example the delay logic may comprise gate propagation delays, charging capacitors or the like, configurable and/or controllable by way of hardware or software control logic. For example, the delay logic may comprise one or more adder circuits arranged to configure hardware components, for example in the form of gate propagation delays, charging capacitors or the like, to delay the rising and falling edges of the modulated waveform signal generated by the timer logic.

Alternatively, examples of the invention may be implemented in a computer program for execution by, for example, a microprocessor of the semiconductor device comprising the delay logic, at least including code portions for performing steps of a method according to the invention when run on the microprocessor or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, stored with data loadable in a memory of a computer system, the data representing the computer program. The data carrier may comprise, by way of example, a hard disk, a CD-ROM, an optical storage device, a magnetic storage device, a ROM (Read Only Memory), a PROM (Programmable Read Only Memory), a EPROM (Erasable Programmable Read Only Memory), a EEPROM (Electrically Erasable Programmable Read Only Memory) and a Flash memory. Alternatively, the data carrier may further be a data connection, such as a telephone cable or a wireless connection.

In the foregoing specification, the invention has been described with reference to specific examples of embodiments of the invention. It will, however, be evident that various modifications and changes may be made therein without departing from the scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Because the apparatus implementing embodiments of the invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the examples of the invention described herein are, for example, capable of operation in other orientations than those illustrated or otherwise described herein.

The term 'program,' as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. A mere fact that certain measures are recited in mutually different claims does not indicate that a combination of these measures cannot be used to advantage.

The invention claimed is:

1. A semiconductor device comprising:
   timer logic for generating a first modulated waveform signal;
   delay logic operably coupled to the timer logic and arranged to provide a first delay in a rising edge of the first modulated waveform signal generated by the timer logic and provide a second delay in a falling edge of the first modulated waveform signal generated by the timer logic, such that the first delay and second delay of the first modulated waveform signal form a second, refined modulated waveform signal that comprises a higher frequency resolution than a frequency resolution of the first modulated waveform signal;

wherein the delay in the rising edge of the first modulated waveform signal 'td1[k]' comprises a rising edge delay increment 'dtL', falling edge delay increment 'dtH' and a rising edge delay value calculated in the preceding waveform cycle 'td1[k−1]'.

2. The semiconductor device of claim 1 wherein the delay logic is arranged to cause the first delay in the rising edge of the first modulated waveform and the second delay in the falling edge of the first modulated waveform signal, such that the second, refined modulated waveform signal further comprises a higher pulse width resolution than a pulse width resolution of the first modulated waveform signal generated by the timer logic.

3. The semiconductor device of claim 2 wherein the delay logic comprises a rising edge delay component arranged to cause the first delay in the rising edge of the first modulated waveform signal generated by the timer logic.

4. The semiconductor device of claim 2 wherein the delay logic comprises a falling edge delay component arranged to cause the second delay in the falling edge of the first modulated waveform signal generated by the timer logic.

5. The semiconductor device of claim 2 wherein the second delay in the falling edge of the first modulated waveform signal, 'td$_2$[k]' comprises a falling edge delay increment 'dt$_H$', a falling edge delay increment 'dt$_L$', and a falling edge delay value calculated in the previous waveform cycle 'td$_2$[k−1]'.

6. The semiconductor device of claim 1 wherein the delay logic comprises a rising edge delay component arranged to cause the first delay in the rising edge of the first modulated waveform signal generated by the timer logic.

7. The semiconductor device of claim 6 wherein the second delay in the falling edge of the first modulated waveform signal, 'td$_2$[k]' comprises a falling edge delay increment 'dt$_H$', a falling edge delay increment 'dt$_L$' and a falling edge delay value calculated in the previous waveform cycle 'td$_2$[k−1]'.

8. The semiconductor device of claim 1 wherein the delay logic comprises a falling edge delay component arranged to cause the second delay in the falling edge of the first modulated waveform signal generated by the timer logic.

9. The semiconductor device of claim 1 wherein the second delay in the falling edge of the first modulated waveform signal, 'td$_2$[k]' comprises a falling edge delay increment 'dt$_H$', a falling edge delay increment 'dt$_L$' and a falling edge delay value calculated in the previous waveform cycle 'td$_2$[k−1]'.

10. The semiconductor device of claim 9 wherein if an edge delay 'td$_{1(2)}$', is out of a delay module operational range <0,x*dt>, where dt =Period$_{CLK}$/(x+1) and x ={1,2, . . . }, the delay comprises td,$_{1(2)}$=n*Period$_{CLK}$+m*dt, where n=Integer Division(td$_{1(2)}$,((x+1)*dt)) and m=Modulo Division(td$_{1(2)}$,((x+1)*dt)).

11. The semiconductor device of claim 10 wherein a high pulse width of the refined modulated waveform signal comprises 'i* Period$_{CLK}$+dt$_H$' and a low pulse width of the refined modulated waveform signal comprises 'j*Period$_{CLK}$+dt$_L$', where: coefficients 'i' and 'j' are dependent upon a timer implementation and a duty cycle of the timer generated rough waveform signal, and parameters 'dt$_L$' and 'dt$_H$' comprise rising and falling edge delay increments, respectively.

12. The semiconductor device of claim 11 wherein a period of the refined modulated waveform signal equals to '(i+j)* Period$_{CLK}$+dt$_L$+dt$_H$'.

13. The semiconductor device of claim 11 wherein the semiconductor device comprises a hardware adder module arranged to calculate refined edge delays for a modulated pulse, and to generate the timer hold clock pulse.

14. The semiconductor device of claim 1 wherein the delay logic comprises a timer hold clock line, operably coupled to the timer logic and arranged to enable the delay logic to cause the timer logic to suspend the first modulated waveform signal.

15. The semiconductor device of claim 14 wherein suspension of the first modulated waveform signal causes a re-synchronization of the first modulated waveform signal with the refined modulated waveform signal.

16. The semiconductor device of claim 1 wherein the delay logic comprises at least one adder module.

17. A method for generating a modulated waveform signal comprising:

receiving a first modulated waveform signal; and generating a second, refined modulated waveform signal by causing a first delay in a rising edge of the first modulated waveform signal and causing a second delay in a falling edge of the first modulated waveform signal, such that the resulting second, refined modulated waveform signal comprises at least a higher frequency resolution than a frequency resolution of the first modulated waveform signal, wherein the delay in the rising edge of the first modulated waveform signal 'td$_1$[k]' comprises a rising edge delay increment 'dt$_L$', falling edge delay increment 'dt$_H$' and a rising edge delay value calculated in the preceding waveform cycle 'td$_1$[k−1]'.

18. A computer-readable storage element having computer readable code stored thereon for programming a computer to perform a method for generating a modulated waveform signal, the code operable for:

receiving a first modulated waveform signal; and generating a second, refined modulated waveform signal by causing a first delay in a rising edge of the first modulated waveform signal and causing a second delay in a falling edge of the first modulated waveform signal, such that the resulting second, refined modulated waveform signal comprises at least a higher frequency resolution than a frequency resolution of the first modulated waveform signal, wherein the delay in the rising edge of the first modulated waveform signal 'td$_1$[k]' comprises a rising edge delay increment 'td$_L$', falling edge delay increment 'td$_H$' and a rising edge delay value calculated in the preceding waveform cycle 'td$_1$[k−1]'.

19. The computer-readable storage medium of claim 18, wherein the computer readable storage medium comprises at least one of a hard disk, a CD-ROM, an optical storage device, a magnetic storage device, a ROM (Read Only Memory), a PROM (Programmable Read Only Memory), a EPROM (Erasable Programmable Read Only Memory), a EEPROM (Electrically Erasable Programmable Read Only Memory) and a Flash memory.

* * * * *

UNITED STATES PATENT AND TRADEMARK OFFICE
CERTIFICATE OF CORRECTION

| | | |
|---|---|---|
| PATENT NO. | : 8,278,988 B2 | Page 1 of 1 |
| APPLICATION NO. | : 12/997104 | |
| DATED | : October 2, 2012 | |
| INVENTOR(S) | : Martin Mienkina et al. | |

It is certified that error appears in the above-identified patent and that said Letters Patent is hereby corrected as shown below:

At column 12, line 52, claim 18, please change "increment '$td_L$', falling" to -- increment '$dt_L$', falling --

At column 12, line 53, claim 18, please change "increment '$td_H$' and a rising" to -- increment '$dt_H$', and a rising --

Signed and Sealed this
Twenty-ninth Day of January, 2013

David J. Kappos
*Director of the United States Patent and Trademark Office*